(12) United States Patent
Michigami et al.

(10) Patent No.: US 11,345,784 B2
(45) Date of Patent: May 31, 2022

(54) RESIN COMPOSITION, AND RESIN FILM, METAL FOIL WITH RESIN, METAL CLAD LAMINATE, WIRING BOARD, AND CIRCUIT MOUNT COMPONENT USING SAME

(71) Applicant: PANASONIC INTELLECTUAL PROPERTY MANAGEMENT CO., LTD., Osaka (JP)

(72) Inventors: Kyosuke Michigami, Hyogo (JP); Tomoaki Sawada, Osaka (JP); Tomohiro Fukao, Osaka (JP); Takatoshi Abe, Osaka (JP); Andy Behr, Newark, NJ (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/291,533

(22) PCT Filed: Nov. 6, 2019

(86) PCT No.: PCT/JP2019/043422
§ 371 (c)(1),
(2) Date: May 5, 2021

(87) PCT Pub. No.: WO2020/095928
PCT Pub. Date: May 14, 2020

(65) Prior Publication Data
US 2021/0363308 A1    Nov. 25, 2021

Related U.S. Application Data

(60) Provisional application No. 62/758,150, filed on Nov. 9, 2018.

(51) Int. Cl.
*C08G 83/00* (2006.01)
*C08G 59/40* (2006.01)
(Continued)

(52) U.S. Cl.
CPC ....... *C08G 83/007* (2013.01); *C08G 59/4028* (2013.01); *C08G 59/4215* (2013.01);
(Continued)

(58) Field of Classification Search
CPC ..................... C08G 83/007; C08G 59/4028
See application file for complete search history.

(56) References Cited

U.S. PATENT DOCUMENTS

2003/0134961 A1    7/2003    Guo et al.
2003/0138398 A1    7/2003    Okumura et al.
(Continued)

FOREIGN PATENT DOCUMENTS

JP    2005-513238    5/2005
JP    2005-154675    6/2005
(Continued)

OTHER PUBLICATIONS

ISR issued in WIPO Patent Application No. PCT/JP2019/043422, dated Jan. 28, 2020, English translation.
(Continued)

*Primary Examiner* — Megan McCulley
(74) *Attorney, Agent, or Firm* — Greenblum & Bernstein, P.L.C.

(57) ABSTRACT

One aspect of the present invention relates to a resin composition containing a polyrotaxane (A), an epoxy resin (B), and a curing agent (C), in which the curing agent (C) contains an acid anhydride (C-1) in an amount of 0.1 parts by mass or more and less than 10 parts by mass based on a total of 100 parts by mass of the polyrotaxane (A), the epoxy resin (B), and the curing agent (C).

13 Claims, 6 Drawing Sheets

(51) Int. Cl.
    *C08G 59/42*     (2006.01)
    *H05K 1/02*     (2006.01)
    *H05K 1/03*     (2006.01)
    *H05K 3/02*     (2006.01)
    *H05K 3/46*     (2006.01)
    *H05K 3/30*     (2006.01)

(52) U.S. Cl.
    CPC ........... *H05K 1/028* (2013.01); *H05K 1/0353* (2013.01); *H05K 3/025* (2013.01); *H05K 3/4655* (2013.01); *H05K 3/301* (2013.01); *H05K 2203/06* (2013.01)

(56) References Cited

U.S. PATENT DOCUMENTS

| | | |
|---|---|---|
| 2006/0263598 A1 | 11/2006 | Guo et al. |
| 2008/0097039 A1 | 4/2008 | Ito et al. |
| 2009/0088546 A1 | 4/2009 | Ito et al. |
| 2011/0262746 A1* | 10/2011 | Arai .................. C09J 7/38 428/352 |
| 2015/0373838 A1 | 12/2015 | Sawada et al. |
| 2016/0122605 A1 | 5/2016 | Hayashi |
| 2016/0152016 A1 | 6/2016 | Abe et al. |
| 2016/0264813 A1 | 9/2016 | Sawada et al. |
| 2016/0266668 A1 | 9/2016 | Sawada et al. |
| 2016/0340485 A1 | 11/2016 | Nomura et al. |
| 2018/0263113 A1 | 9/2018 | Sawada et al. |
| 2020/0020881 A1 | 1/2020 | Zhang |

FOREIGN PATENT DOCUMENTS

| | | |
|---|---|---|
| JP | 2006-316089 | 11/2006 |
| JP | 4482633 | 6/2010 |
| JP | 2016-102669 | 6/2016 |
| JP | 2016-160316 | 9/2016 |
| JP | 2016-534164 | 11/2016 |
| JP | 2018-145385 | 9/2018 |
| WO | 01/083566 | 11/2001 |
| WO | 2014/196636 | 12/2014 |
| WO | 2005/129513 | 9/2015 |
| WO | 2015/129513 | 9/2015 |
| WO | 2019/085493 | 5/2019 |
| WO | 2020/147731 | 7/2020 |

OTHER PUBLICATIONS

Decision to Grant Patent issued in JP Application No. 2020556108, dated Jan. 26, 2021, English translation.

* cited by examiner

PEEL OFF PET

EXAMPLE 19

EXAMPLE 23

FIG. 6
EXAMPLE 19
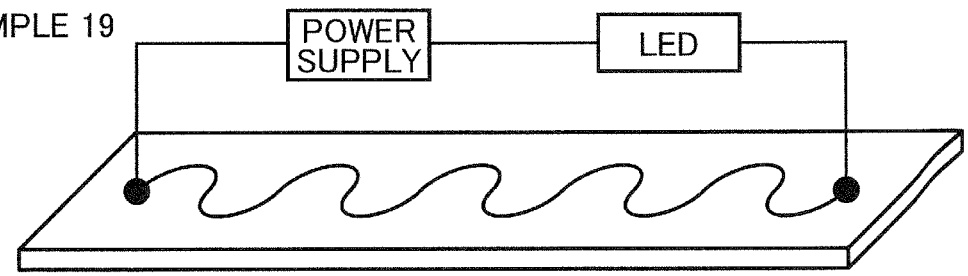
EXAMPLE 20
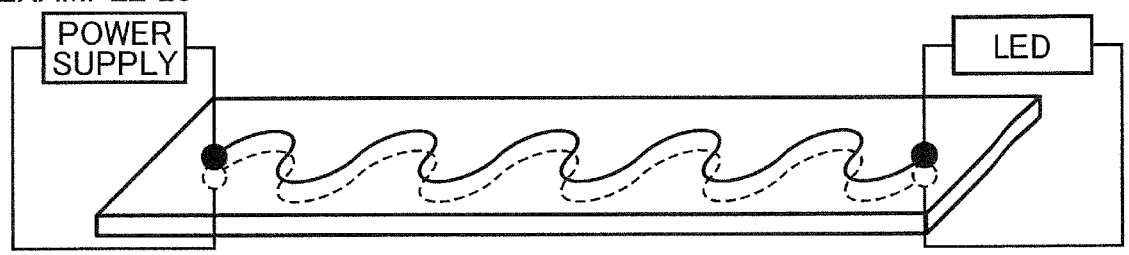
EXAMPLE 21
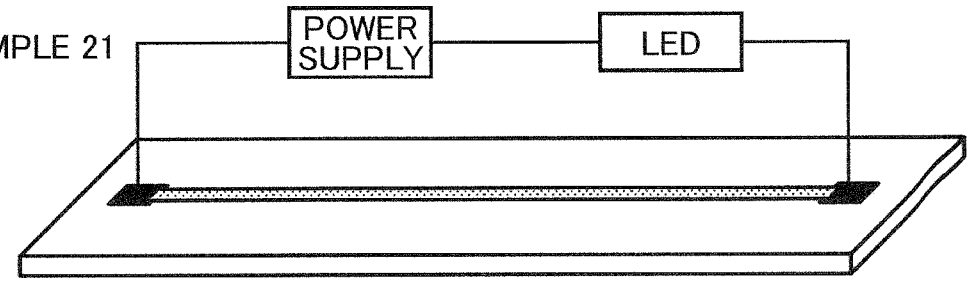
EXAMPLE 22
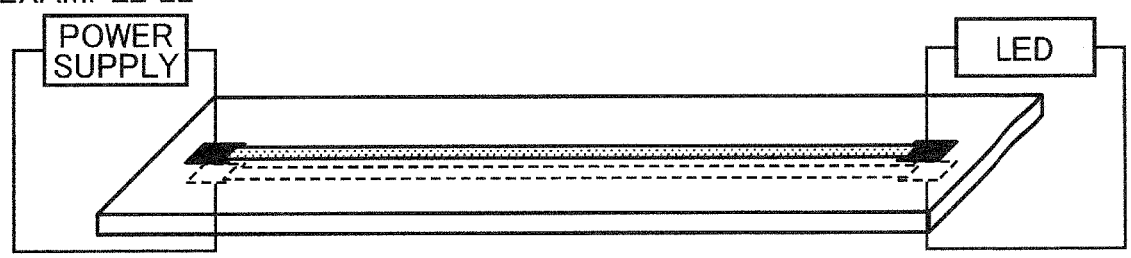
EXAMPLE 23
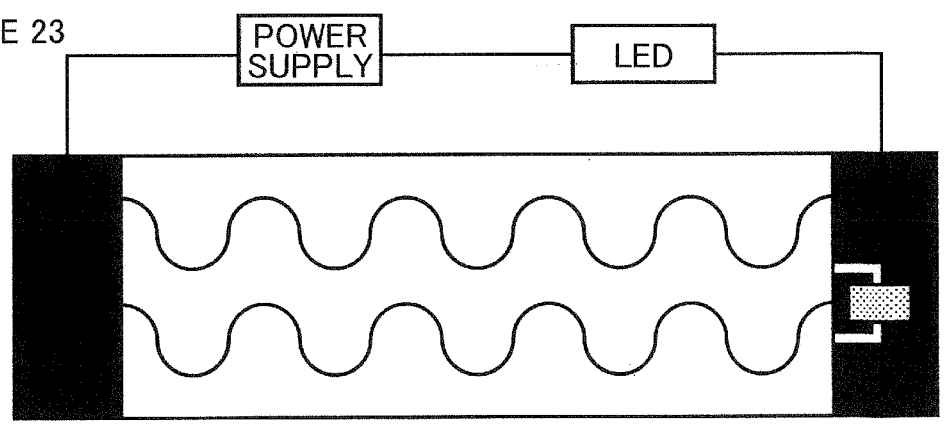

RESIN COMPOSITION, AND RESIN FILM, METAL FOIL WITH RESIN, METAL CLAD LAMINATE, WIRING BOARD, AND CIRCUIT MOUNT COMPONENT USING SAME

TECHNICAL FIELD

The present invention relates to a resin composition, and a resin film, a metal foil with resin, a metal clad laminate, a wiring board, and a circuit mount component using the resin composition.

BACKGROUND ART

Thermosetting resins are used in a wide range of fields such as electronic materials and optical materials due to their excellent heat resistance, chemical resistance, moldability, insulation reliability, and the like. In particular, an epoxy resin is often used in a variety of applications as the thermosetting resin. While the epoxy resin is excellent in the above characteristics, it is also known that it is generally hard and lacks flexibility. Therefore, it may be deformed or destroyed by external stress or thermal stress.

In recent years, stretchable film materials have been studied as materials for environmentally friendly electronics such as printed electronics, wearable electronics, and IoT (Internet of Things). As such stretchable film materials, silicone resins, fluorine resins, urethane resins, and the like have been widely studied. However, since silicone resins and fluorine resins have poor adhesion and urethane resins have low heat resistance, there is a concern about heat resistance to meet a process represented by solder mounting.

To solve these problems, a method has been proposed so far, in which both heat resistance and stretchability like rubber are achieved by blending a rotaxane (polyol resin) with a polymer or a resin to impart stress relaxation (Patent Literatures 1 and 2).

However, although excellent stretchability and heat resistance can be obtained, the techniques described in Patent Literatures 1 and 2 may have problems in storage stability and life when used in a resin varnish or a resin film. Also, it has been found that when a metal foil with resin or a metal clad laminate is formed by laminating with a metal foil, the adhesion between the metal foil and the resin layer may become a problem.

The present invention were made in view of such circumstances, and an object of the present invention is to provide a resin composition having both flexibility and heat resistance after cured and further having high storage stability, and a resin film, a metal foil with resin, a metal clad laminate, a wiring board, and a circuit mount component using the resin composition.

CITATION LIST

Patent Literature

Patent Literature 1: JP 2016-534164 A
Patent Literature 2: JP 2018-145385 A

SUMMARY OF INVENTION

As a result of diligent studies, the present inventors have found that the above problems can be solved by a resin composition having the following composition, and have completed the present invention by conducting further studies based on such findings.

That is, the resin composition according to one aspect of the present invention is a resin composition containing a polyrotaxane (A), an epoxy resin (B), and a curing agent (C), in which the curing agent (C) contains an acid anhydride (C-1) in an amount of 0.1 parts by mass or more and less than 10 parts by mass based on a total of 100 parts by mass of the polyrotaxane (A), the epoxy resin (B), and the curing agent (C).

BRIEF DESCRIPTION OF DRAWINGS

FIG. 6 is a schematic view of conductivity tests performed using the wiring boards and the circuit mount components prepared in Examples 19 to 23.

DESCRIPTION OF EMBODIMENTS

Figure 1:
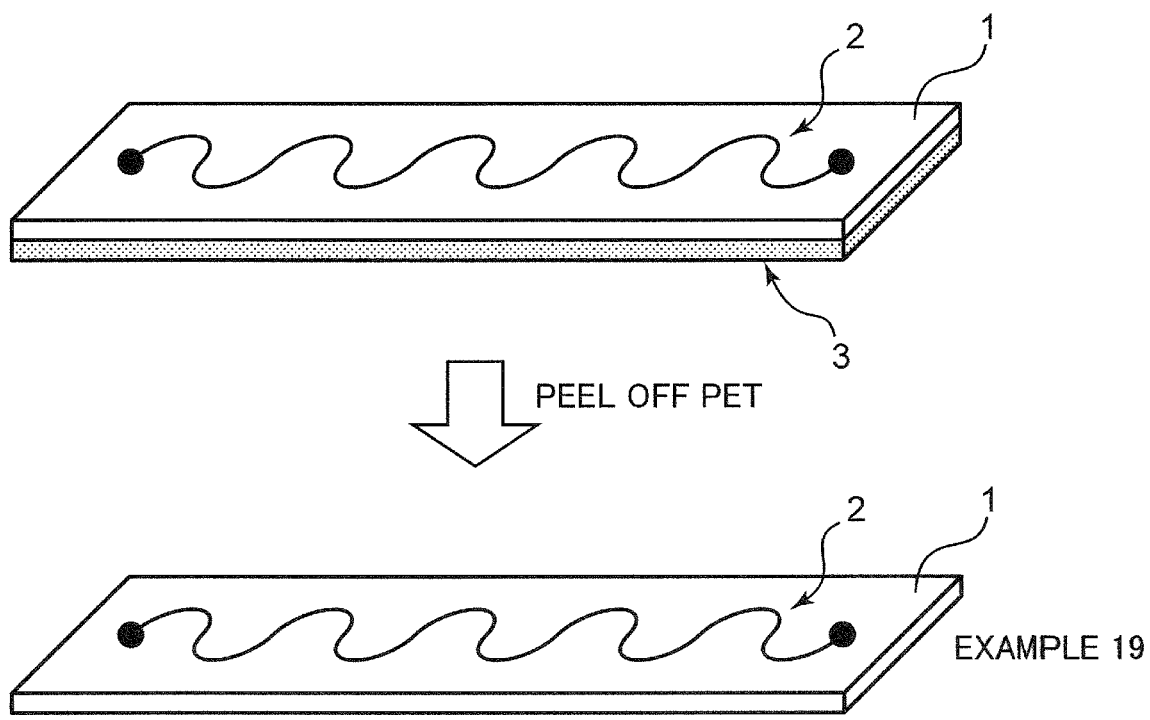
FIG. 1 is a schematic view showing a method of preparing a single-sided wiring board in Example 19.

Hereinafter, embodiments according to the present invention will be specifically described, but the present invention is not limited thereto.

As described above, the resin composition according to the present embodiment is a resin composition containing a polyrotaxane (A), an epoxy resin (B), and a curing agent (C), in which the curing agent (C) contains an acid anhydride (C-1) in an amount of 0.1 parts by mass or more and less than 10 parts by mass based on a total of 100 parts by mass of the polyrotaxane (A), the epoxy resin (B), and the curing agent (C).

According to such a composition, the storage stability of a varnish (resin composition) or a resin film can be improved, and the flexibility after curing can be ensured. That is, according to the present invention, a resin composition, having both flexibility and/or extensibility and heat resistance after cured, and further having high storage stability, can be obtained.

Further, since the resin composition of the present invention has the above characteristics, it can be applied as an electronic material to various technical fields such as an optical field, an electronic field, an adhesion field, and a medical field in addition to IoT and flexible display devices. Thus, it is very advantageous for industrial use.

In the present embodiment, having "flexibility" means having a property of being able to follow the deformation in tension and bending with a small stress, and more specifically, it means that an elastic modulus (elastic modulus measured in the measurement method in the later-described Examples) is 40 MPa or less.

Further, the cured product of the resin composition of the present embodiment has preferably extensibility of 10% to 500%, and more preferably extensibility of 30/a to 300%. When the extensibility exhibits an elongation rate of 10% or more, there are advantages that the followability when deforming into an arbitrary shape is high and it is hard to be destroyed. The upper limit of the extensibility is not particularly limited, but 500% is considered to be enough.

Hereinafter, the resin composition of the present embodiment will be specifically described, but the present invention is not limited thereto.

(Polyrotaxane (A))

The polyrotaxane (A) to be used in the present embodiment is a molecule having a structure in which a linear axial molecule penetrates a cyclic molecule and the end is closed such that the cyclic molecule does not come off. Specifically, a polyrotaxane resin as described in, for example, JP 4482633 B2 can be mentioned.

By containing such a polyrotaxane resin, the resin composition of the present embodiment can be provided with the characteristics of being excellent in repeated reproducibility and resilience when deformed.

An example of the polyrotaxane that can be used in the present embodiment includes a compound in which a molecule having a terminal functional group as an axial molecule is included in a cyclic molecule in a skewered manner, and this terminal functional group is chemically modified with a blocking group bulky enough to prevent the cyclic molecule from being detached. As long as a compound has such a structure, the structures and types of the molecules constituting the compound, the inclusion ratio of the cyclic molecule, the manufacturing method, and the like are not limited.

For example, an example of the axial molecule that the polyrotaxane can contain is not particularly limited as long as it has a molecular weight of 8,000 or more and the terminal can be chemically modified with a blocking group. Examples thereof include, for example, polyvinyl alcohol, polyvinylpyrrolidone, poly(meth)acrylic acid cellulose resin, polyacrylamide, polyethylene oxide, polyethylene glycol, polypropylene glycol, polyvinyl acetal resin, polyvinyl methyl ether, polyamine, polyethyleneimine, casein, gelatin, starch, polyolefin, polyester, polyvinyl chloride, polystyrene, copolymers such as acrylonitrile-styrene copolymer, acrylic resin, polycarbonate, polyurethane, polyvinyl butyral, polyisobutylene, polytetrahydrofuran, polyamide, polyimide, polydiene, polysiloxane, polyurea, polysulfide, polyphosphazene, polyketone, polyphenylene, polyhaloolefin and its derivatives, and the like. Among them, polyethylene glycol is preferably used.

The cyclic molecule that the polyrotaxane can contain is not particularly limited as long as it is a ring-shaped molecule through which a polymer molecule can pass and has at least one reactive group so that it can react with a cross-linking agent. Specific examples thereof include, for example, cyclodextrins, crown ethers, cryptands, macrocyclic amines, calixarenes, and cyclophanes. Among them, cyclodextrin and substituted cyclodextrin are used, and more preferably, substituted cyclodextrin into which a reactive group (functional group) is further introduced is used.

Preferred examples of the functional group to be introduced into the cyclic molecule of the polyrotaxane include, for example, a hydroxyl group, a carboxyl group, an acrylic group, a methacrylic group, an epoxy group, a vinyl group, and the like. Preferably, the polyrotaxane of the present embodiment has at least one reactive hydroxyl group in its structure. As a result, the curability can be controlled by heat curing, and heat resistance can be imparted. Further, there is an advantage that a tough polymer network is constructed and the breaking strength is improved.

As the polyrotaxane resin of the present embodiment, a polyrotaxane resin having a hydroxyl group equivalent of about 300 to 1000 eq/g is particularly suitable.

With the functional group introduced into the cyclic molecule in this way, the cyclic molecule can be crosslinked with each other or the polyrotaxane can be crosslinked with the resin via a cross-linking agent. Then, the resin connected to the polyrotaxane in this way can acquire flexibility.

The structure (terminal blocking group) that blocks the end of the polyrotaxane of the present embodiment is not particularly limited as long as it has a structure bulky enough to prevent the cyclic molecule from coming off. Specifically, for example, a cyclodextrin group, an adamantane group, a dinitrophenyl group, a trityl group, and the like are preferably used.

The molecule to be used as the above cyclic molecule is not particularly limited as long as it can include a chain polymer molecule in its ring. Cyclodextrin can be mentioned as a cyclic molecule preferably used. Moreover, it is preferable that this cyclic molecule has a functional group. Further, it is preferable that the functional group is an —OH group, an acrylic group, or a methacrylic group.

The polyrotaxane resin that can be used in the present embodiment can also be synthesized by known methods (e.g., the methods described in WO 01/83566 A, JP 2005-154675 A, JP 4482633 B2, etc.). Commercially available products may be used, and specifically, SELM Superpolymers SH3400P, SH2400P, etc., manufactured by ASM Inc. can be used.

The molecular weight of the polyrotaxane resin that can be used in the present embodiment is preferably about 00000 to 1,200,000 g/mol. From the viewpoint of solubility in a solvent, it is more preferably about 100,000 to 800,000 g/mol.

In the resin composition of the present embodiment, the blending amount of the polyrotaxane (A) is not particularly limited, but it is preferably 40 to 89.9 parts by mass, and more preferably about 40 to 60 parts by mass, based on a total of 100 parts by mass of the polyrotaxane (A), the epoxy resin (B), and the curing agent (C). When the blending amount of the polyrotaxane (A) is within this range, there is an advantage that resilience, flexibility, and extensibility can be ensured. The resilience means the property of returning to the original shape when released from tensile stress. If it is less than 40 parts by mass, the flexibility and resilience of the film tend to be poor, and if it is 90 parts by mass or more, sufficient extensibility may not be ensured.

(Epoxy Resin (B))

Specific examples of the epoxy resin (B) used in the resin composition of the present embodiment include, for example, bisphenol A type epoxy resin, bisphenol F type epoxy resin, bisphenol S type epoxy resin, aralkyl epoxy resin, phenol novolac type epoxy resin, alkylphenol novolac type epoxy resin, biphenol type epoxy resin, naphthalene type epoxy resin, and dicyclopentadiene type epoxy resin. In addition, examples thereof include, for example, an epoxidized product of a condensate of phenols and an aromatic aldehyde having a phenolic hydroxyl group, triglycidyl isocyanurate, an alicyclic epoxy resin, and the like. Depending on the situations, they may be used alone or in combination of two or more.

An epoxy resin, having, for example, a benzene ring skeleton in its structure, a molecular weight of 200 g/mol to 6000 g/mol, and an epoxy equivalent of 200 eq/g to 3000 eq/g, is a more preferred example of the epoxy resin. By using such an epoxy resin, there are advantages that: the resin composition is excellent in coatability because it is compatible with various materials and solvents when blended; the extensibility can be maintained without becoming further brittle; and heat resistance can also be achieved.

As such an epoxy resin, a commercially available product may be used. Examples thereof include, for example, JER1003 (manufactured by Mitsubishi Chemical Corporation, bifunctional, molecular weight 1300), JER1010 (manufactured by Mitsubishi Chemical Corporation, bifunctional, molecular weight 5500), EXA-4816 (manufactured by DIC Corporation, molecular weight 824, bifunctional), EP-4003S (manufactured by Adeca Corporation, bifunctional, molecular weight 1000), etc., and in addition to them, a bisphenol A type epoxy resin, a bisphenol F type epoxy resin, a cresol novolac type epoxy resin, a phenol novolac type epoxy resin, and multimers thereof.

The epoxy resins as described above may be used alone or in combination of two or more.

In the resin composition of the present embodiment, the blending amount of the epoxy resin (B) is not particularly limited, but it is preferably about 10 to 60% by mass, and more preferably about 25 to 55% by mass, based on a total of 100 parts by mass of the polyrotaxane (A), the epoxy resin (B), and the curing agent (C). By blending the epoxy resin at such a blending ratio, it is considered that the characteristics of the resin composition, such as heat resistance and flexibility, can be more reliably obtained. If it is less than 10%, the heat resistance and extensibility of the resin may decrease. If it is more than 60%, the flexibility may decrease.

Further, the resin composition of the present embodiment may contain a resin other than the polyrotaxane and the epoxy resin. A urethane resin, an acrylic resin, a fluorine resin, a silicone resin, or the like may be further added depending on the purpose.

(Curing Agent (C))

The resin composition of the present embodiment contains the curing agent (C). The curing agent (C) of the present embodiment is characterized by containing the acid anhydride (C-1) in an amount of 0.1 parts by mass or more and less than 10 parts by mass based on a total of 100 parts by mass of the polyrotaxane (A), the epoxy resin (B), and the curing agent (C).

By using such a curing agent, the storage stability of a resin varnish or a resin film formed can be improved, and the flexibility after curing can be ensured.

If the content of the acid anhydride (C-1) is 0.1 parts by mass or less, the cured product tends to be poorly cured. If the content is 10 parts by mass or more, the storage stability of the resin composition decreases. A more preferred content range is 0.5 parts by mass or more and less than 10.0 parts by mass.

It is also preferable that the curing agent (C) further contains an isocyanate compound (C-2) and the content of the isocyanate compound (C-2) is 0 parts by mass or more and less than 45 parts by mass based on 100 parts by mass of the polyrotaxane (A). An isocyanate compound has high reactivity as a curing agent, and if it is added to a resin composition at a certain ratio or more, the curing of the resin composition progresses while being stored. Therefore, it is more preferable that the content of the isocyanate compound (C-2) in the curing agent (C) is smaller. It is preferably 40 parts by mass or less, more preferably 10 parts by mass or less, and even more preferably 5 parts by mass or less, based on 100 parts by mass of the polyrotaxane (A). Further, the content of the isocyanate compound (C-2) in the curing agent (C) may be 0% by mass.

In addition, the isocyanate compound (C-2) and the acid anhydride (C-1) in an excessive amount have a drawback that even when a metal foil with resin is formed using them, they react with hydroxyl groups derived from the polyrotaxane contained in the resin component or functional groups, such as an epoxy group, of the epoxy resin. Since the hydroxyl groups and the functional groups are involved in the adhesion to the metal foil, the reactions of the isocyanate compound and the acid anhydride in an excessive amount with the functional groups cause a decrease in the adhesion to the metal foil over time.

Further, it is preferable to use a monofunctional acid anhydride as the acid anhydride (C-1), and it is preferable that the ratio of the monofunctional acid anhydride to 100 parts by mass of the curing agent (C) is 30 parts by mass or more. As a result, it is considered that the storage stability of the resin composition is further improved. The ratio of the acid anhydride (C-1) to the curing agent (C) is more preferably 70 parts by mass or more. The upper limit of the ratio is not particularly limited and may be 100 parts by mass. In other words, the curing agent (C) contains the monofunctional acid anhydride in an amount of preferably 30% by mass or more, and more preferably 70% by mass or more. 100% by mass of the curing agent may be the monofunctional acid anhydride.

When a monofunctional acid anhydride is used, the molar ratio of the monofunctional acid anhydride to the hydroxyl group derived from the polyrotaxane (A) is preferably in the range of 0.01 to 0.8. Since the hydroxyl group of the polyrotaxane (A) is involved in the adhesion between the resin layer containing the resin composition of the present embodiment and the metal foil, it is preferable to contain the monofunctional acid anhydride in such a range. The monofunctional acid anhydride is a component necessary for the curing treatment of the resin composition of the present embodiment, but if the molar ratio is too large, it causes a decrease in the adhesion to a metal foil with resin formed. Further, there is a risk that the elastic modulus after curing (metal clad laminate) may become too high.

When a monofunctional acid anhydride is used, the molar ratio of the monofunctional acid anhydride to the epoxy group derived from the epoxy resin (B) is preferably in the range of 0.01 to 1.1. The epoxy group derived from the epoxy resin (B) is involved in the adhesion between the resin layer containing the resin composition of the present embodiment and the metal foil, similarly to the hydroxyl group derived from the polyrotaxane (A) described above. Thus, it is preferable to contain the monofunctional acid anhydride in such a range. If the molar ratio is too large, it causes a decrease in the adhesion to a metal foil with resin formed. Further, there is a risk that the elastic modulus after curing (metal clad laminate) may become too high.

Examples of the monofunctional anhydride having an aromatic moiety include, for example, phthalic anhydride, 3-methylphthalic anhydride, 4-methylphthalic anhydride, trimellitic anhydride, and the like.

Examples of the monofunctional anhydride that is an alicyclic compound include hexahydrophthalic anhydride, 1-methylhexahydrophthalic anhydride, 1,2,3,6-tetrahydrophthalic anhydride, 1-methyl-1,2,3,6-tetrahydrophthalic anhydride, 3-methyl-1,2,3,6-tetrahydrophthalic anhydride, 4-methylhexahydrophthalic anhydride, 1-methylbicyclo[2,2,1]heptane-2,3-dicarboxylic acid anhydride, methylbicyclo[2,2,1]heptane-2,3-dicarboxylic acid anhydride, 1-methylbicyclo[2,2,1]heptane-2,3-dicarboxylic acid anhydride, maleic anhydride, trimellitic anhydride, YH306 (Mitsubishi Chemical Corporation, monofunctional acid anhydride, molecular weight 234), YH307 (Mitsubishi Chemical Corporation, monofunctional acid anhydride, molecular weight 231), H-TMAn (Mitsubishi Gas Chemical Co., Inc., hexahydrophthalic anhydride), HH (New Japan Chemical Co., Ltd., hexahydrophthalic anhydride), HN-5500 (Hitachi Chemical Co., Ltd., 3- or 4-hexahydrophthalic anhydride), and the like.

Among them, alicyclic compounds are preferable. When the monofunctional anhydride is an aromatic compound, it leads to coloring of an insulating layer formed by the resin composition. Therefore, when an insulating layer that is colorless and transparent or has a low degree of coloring is desired, it is preferable to use an alicyclic compound. In order to suppress volatilization in the drying and curing steps, the acid anhydride has a molecular weight of preferably 150 g/mol or more, and more preferably 190 g/mol or more.

The curing agent (C) may contain a curing agent other than the above curing agent as long as the effects of the present invention are not impaired. It may further contain, for example, a phenol resin, an amine-based compound, an imidazole-based compound, a sulfide resin, a dicyandiamide, a light/UV curing agent, a thermal cationic curing agent, and the like, each acting as a curing agent for a thermosetting resin.

Depending on the situations, the curing agents (C) may be used alone or in combination of two or more.

In the resin composition of the present embodiment, the blending amount of the curing agent (C) is not particularly limited, but it is preferably 0.1 parts by mass or more and 10 parts by mass or less, and more preferably about 0.5 to 5 parts by mass, based on a total of 100 parts by mass of the polyrotaxane (A), the epoxy resin (B), and the curing agent (C).

(Color Material (D))

The resin composition of the present embodiment may further contain a color material. By containing a color material, it can be further used as a base material having visibility, designability, and/or concealability that intentionally hides an inner layer core, electronic components, and the like.

Examples of a color material (D) that can be used in the present embodiment include carbon black, pigments, dyes, and the like without particular limitation. As the pigments, either inorganic pigments or organic pigments can be used. Examples of the inorganic pigments include, for example, titanium oxide, zinc oxide, zinc sulfide, white lead, calcium carbonate, precipitated barium sulfate, white carbon, alumina white, kaolin clay, talc, bentonite, black iron oxide, cadmium red, rouge, molybdenum red, molybdate orange, chrome vermillion, chrome yellow, cadmium yellow, yellow iron oxide, titanium yellow, chromium oxide, viridian, titanium cobalt green, cobalt green, cobalt chrome green, victoria green, ultramarine, navy blue, cobalt blue, cerulean blue, cobalt silica blue, cobalt zinc silica blue, manganese violet, cobalt violet, and the like.

Examples of the organic pigments include, for example, azo pigments, phthalocyanine pigments, anthraquinone pigments, quinacridone pigments, isoindolinone pigments, quinophthalone pigments, dye lake pigments, fluorescent pigments, and the like.

More specifically, examples of cyan pigments include, for example, C.I. Pigment Blue 1, 2, 3, 15:1, 15:3, 15:4, 15:6, 16, 21, 22, 60, 64, and the like.

Examples of magenta pigments include, for example, C.I. Pigment Red 5, 7, 9, 12, 31, 48, 49, 52, 53, 57, 97, 112, 120, 122, 146, 147, 149, 150, 168, 170, 177, 178, 179, 184, 188, 202, 206, 207, 209, 238, 242, 254, 255, 264, 269, 282, C.I. Pigment Violet 19, 23, 29, 30, 32, 36, 37, 38, 40, 50, and the like.

Examples of yellow pigments include, for example, C.I. Pigment Yellow 1, 2, 3, 12, 13, 14, 16, 17, 20, 24, 74, 83, 86, 93, 94, 95, 109, 110, 117, 120, 125, 128, 129, 137, 138, 139, 147, 148, 150, 151, 154, 155, 166, 168, 180, 185, 213, and the like.

Examples of black pigments include, for example, carbon black manufactured by a furnace method or a channel method. In particular, these carbon blacks, having characteristics in which a primary particle size is 11 to 40 nm, a specific surface area by the BET method is 50 to 400 $m^2/g$, a volatile content is 0.5 to 10%, a pH value is 2 to 10, and the like, are suitable. Commercially available products having such characteristics include, for example, No. 33, 40, 45, 52, 900, 2200B, 2300, MA7, MA8, MCF88 (all manufactured by Mitsubishi Chemical Corporation), RAVEN1255 (manufactured by Colombian Carbon Co., Ltd.), REGA330R, 400R, 660R, MOGUL L, ELFTEX415 (all manufactured by Cabot Corporation), Nipex90, Nipex150T, Nipex160IQ, Nipex170IQ, Nipex75, Printex85, Printex95, Printex90, Printex35, PrintexU (all manufactured by Evonik Degussa GmbH), and the like.

Example of the pigments other than cyan, magenta, yellow, and black include, for example, C.I. Pigment Green 7, 10, 36, C.I. Pigment Brown 3, 5, 25, 26, C.I. Pigment Orange 2, 5, 7, 13, 14, 15, 16, 24, 34, 36, 38, 40, 43, 62, 63, 64, 71, and the like.

When using, these pigments can be directly mixed with a resin varnish, and as another method, they can be uniformly dispersed in a dispersion medium such as a solvent in advance and then be blended. Examples of the method of dispersing the pigment include: a method of surface-modifying the pigment by an oxidation treatment or the like and self-dispersing the pigment without a dispersant; a method of dispersing the pigment using a surfactant or a resin as a dispersant; and the like.

As the dye, various commercially available dyes can be used. Examples thereof include direct dyes, acidic dyes, edible dyes, basic dyes, reactive dyes, disperse dyes, vat dyes, and the like.

More specific examples of cyan dyes include, for example, C.I. Acid Blue 1, 7, 9, 15, 22, 23, 25, 27, 29, 40, 41, 43, 45, 54, 59, 60, 62, 72, 74, 78, 80, 82, 83, 90, 92, 93, 100, 102, 103, 104, 112, 113, 117, 120, 126, 127, 129, 130, 131, 138, 140, 142, 143, 151, 154, 158, 161, 166, 167, 168, 170, 171, 182, 183, 184, 187, 192, 199, 203, 204, 205, 229, 234, 236, 249, C.I. Direct Blue 1, 2, 6, 15, 22, 25, 41, 71, 76, 77 78, 80, 86, 87, 90, 98, 106, 108, 120, 123, 158, 160, 163, 165, 168, 192, 193, 194, 195, 196, 199, 200, 201, 202, 203, 207, 225, 226, 236, 237, 246, 248, 249, C.I. Reactive Blue 1, 2, 3, 4, 5, 7, 8, 9, 13, 14, 15, 17, 18, 19, 20, 21, 25, 26, 27, 28, 29, 31, 32, 33, 34, 37, 38, 39, 40, 41, 43, 44, 46, C.I. Food Blue 1, 2, C.I. Basic Blue 9, 25, 28, 29, 44, and the like.

Examples of magenta dyes include, for example, C.I. Acid Red 1, 6, 8, 9, 13, 14, 18, 26, 27, 32, 35, 37, 42, 51, 52, 57, 75, 77, 80, 82, 85, 87, 88, 89, 92, 94, 97, 106, 111, 114, 115, 117, 118, 119, 129, 130, 131, 133, 134, 138, 143, 145, 154, 155, 158, 168, 180, 183, 184, 186, 194, 198, 209, 211, 215, 219, 249, 252, 254, 262, 265, 274, 282, 289, 303, 317, 320, 321, 322, C.I. Direct Red 1, 2, 4, 9, 11, 13, 17, 20, 23, 24, 28, 31, 33, 37, 39, 44, 46, 62, 63, 75, 79, 80, 81, 83, 84, 89, 95, 99, 113, 197, 201, 218, 220, 224, 225, 226, 227, 228, 229, 230, 231, C.I. Reactive Red 1, 2, 3, 4, 5, 6, 7, 8, 11, 12, 13, 15, 16, 17, 19, 20, 21, 22, 23, 24, 28, 29, 31, 32, 33, 34, 35, 36, 37, 38, 39, 40, 41, 42, 43, 45, 46, 49, 50, 58, 59, 63, 64, C.I. Food Red 7, 9, 14, and the like.

Examples of yellow dyes include, for example, C.I. Acid Yellow 1, 3, 11, 17, 19, 23, 25, 29, 36, 38, 40, 42, 44, 49, 59, 61, 70, 72, 75, 76, 78, 79, 98, 99, 110, 111, 127, 131, 135, 142, 162, 164, 165, C.I. Direct Yellow 1, 8, 11, 12, 24, 26, 27, 33, 39, 44, 50, 58, 85, 86, 87, 88, 89, 98, 110, 132, 142, 144, Reactive Yellow 1, 2, 3, 4, 6, 7, 11, 12, 13, 14, 15, 16, 17, 18, 22, 23, 24, 25, 26, 27, 37, 42, C.I. Food Yellow 3, 4, and the like.

Examples of black dyes include, for example, C.I. Direct Black 1, 7, 19, 32, 51, 71, 108, 146, 154, 166, and the like.

Examples of the dyes other than cyan, magenta, yellow, and black include, for example, C.I. Acid Green 7, 12, 25, 27, 35, 36, 40, 43, 44, 65, 79, C.I. Direct Green 1, 6, 8, 26, 28, 30, 31, 37, 59, 63, 64, C.I. Reactive Green 6, 7, C.I. Direct Violet 2, 48, 63, 90, C.I. Reactive Violet 1, 5, 9, 10, and the like.

When the color material (D) is contained, the content thereof is not particularly limited, but it is preferably about 0.01 parts by mass to 10 parts by mass, and more preferably about 0.1 to 1 part by mass, based on a total of 100 parts by mass of the polyrotaxane (A), the epoxy resin (B), and the curing agent (C).

Further, the resin composition of the present embodiment may contain, if necessary, other additives such as, for example, a curing catalyst (curing accelerator), a dispersant, a flame retardant, a flame retardant aid, a leveling agent, in ranges where the effects of the present invention are not impaired.

(Curing Accelerator)

The curing accelerator that can be used in the present embodiment is not particularly limited, but for example, imidazoles and derivatives thereof, organophosphorus compounds, metal soaps such as zinc carboxylate, phosphonium salts, sulfonium salts, boron complexes, secondary amines, tertiary amines, quaternary ammonium salts, and the like can be used. Depending on the situations, they may be used alone or in combination of two or more. When the curing accelerator is used, the content thereof is preferably about 0.1 parts by mass to 10 parts by mass, and more preferably about 0.25 to 5 parts by mass, based on a total of 100 parts by mass of the polyrotaxane (A), the epoxy resin (B), and the curing agent (C).

(Dispersant)

When the resin composition of the present embodiment contains the color material (D), it is preferable to further add a dispersant for the purpose of improving the dispersion stability between the color material (D) and the resin component. Any dispersant is not particularly limited as long as it is effective as a dispersant. Examples thereof include, for example, copolymers containing an acid group, pigment-affinitive block copolymers, phosphate ester compounds, polyether phosphate ester compounds, fatty acid ester compounds, alkylene oxide copolymers, modified polyether polymers, fatty acid derivatives, urethane polymers, and the like. Examples of commercially available dispersants include DISPERBYK series manufactured by BYK; SOL-SPERSE series manufactured by Lubrizol Japan; SOKA-LAN, TAMOL, Efka series manufactured by BASF; NUOSPERSE series manufactured by Elementis; DISPAR-LON series manufactured by Kusumoto Chemicals, Ltd.; FLOWLEN series manufactured by Kyoeisha Chemical Co., Ltd.; AJISPER series manufactured by Ajinomoto Fine-Techno Co., Inc.; and the like. Depending on the situations, they may be used alone or in combination of two or more. It is preferable to use them so that the content thereof is about 2:1 (mass ratio) with respect to the color material (D) contained in the resin composition.

(Method of Preparing Resin Composition)

A method of preparing the resin composition of the present embodiment is not particularly limited. For example, the polyrotaxane (A), the epoxy resin (B), the curing agent (C), and a solvent are first mixed to be uniform, so that the resin composition (varnish-like resin composition) of the present embodiment can be obtained. The solvent to be used is not particularly limited, and for example, toluene, xylene, methyl ethyl ketone, acetone, ethyl acetate, and the like can be used. These solvents may be used alone or in combination of two or more. In addition, an organic solvent for adjusting the viscosity and various additives may be blended, if necessary.

The molded product, which is a dried product, a partially-cured product, or a cured product of the resin composition thus obtained, can be used as a material for various electronic components in various applications. In particular, it is very useful for industrial use because it is excellent in storage stability, flexibility, and extensibility, and also excellent in the adhesion to a supporting base material, a metal foil, or the like.

(Resin Film)

The resin composition obtained as described above is coated to a film-supporting base material and heat-dried, so that a resin film can be obtained by drying or partially curing the resin composition while evaporating the solvent. That is, the present invention also includes a resin film that has both a resin layer containing a dried or partially-cured product of the above resin composition and a film-supporting base material.

The method of forming the resin film is not particularly limited. For example, coating machines used for general purposes, such as a spin coat, a bar coater, a comma coater, a die coater, a roll coater, and a gravure coater, can be used.

The supporting base material used in the resin film of the present embodiment is not particularly limited. For example, a rigid support such as glass, metal, or a printed wiring board may be used, or a support having flexibility and stretchability, such as a resin film, a flexible substrate, or an elastomer, can also be used. Specific examples of the film-supporting base material include: films such as a polyimide film, a PET (polyethylene terephthalate) film, polyethylene naphthalate film, a polyester film, a polyparavanic acid film, a polyether ether ketone film, a polyphenylene sulfide film, an aramid film, a polycarbonate film, a polyarylate film; and the like.

The method, apparatus, and conditions for heat-drying and curing the resin composition may be various means similar to those used before, or improved means thereof. The specific heating temperature and time can be appropriately set depending on the curing agent and solvent used.

For example, the drying step can be selected depending on the solvent used, but is preferably about 50 to 120° C., and is preferably set around the boiling point of the solvent. The drying time may be any as long as the solvent component is volatilized, and is preferably about 5 minutes to 1 hour. If the drying temperature is too high, the solvent volatilizes rapidly from the coating film, resulting in poor appearance of the film. If the drying temperature is too low, the solvent component remains, and when the temperature is raised in the next curing step, the solvent residue volatilizes rapidly from the coating film, resulting in poor appearance.

The curing temperature of curing step can be selected depending on the curing agent used, but is preferably 80 to 220° C. The curing time is preferably set in the range of 60 minutes to 24 hours in order to obtain a desired partially-cured or cured product.

In the present embodiment, the "partially-cured product" is a product in a state in which the resin composition is partially cured to the extent that it can be further cured. That is, the partially-cured product is a product in a state in which the resin composition is partially cured (B-staged). For example, when the resin composition is heated, the viscosity gradually decreases first, and then curing starts and the viscosity gradually increases. In such a case, the partially-cured state includes a state from when the viscosity starts to increase to before it is completely cured.

In addition, in the present embodiment, the "dried product" means a resin composition before being cured (the resin composition in the A stage) in which the solvent is dried.

(Metal Foil with Resin)

The metal foil with resin of the present embodiment includes a resin layer containing both a dried or partially-cured product of the resin composition described above and a metal foil. The resin layer and the metal foil are laminated.

Examples of the method of manufacturing such a metal foil with resin include, for example, a method in which the varnish-like resin composition as described above is coated to the surface of a metal foil such as a copper foil and then dried. Examples of the coating method include a spin coat, a bar coater, a comma coater, a die coater, a roll coater, a gravure coater, and the like.

As the metal foil, metal foils used in metal clad laminates, wiring boards, and the like can be used without limitation. Examples thereof include, for example, a copper foil, an aluminum foil, and the like.

In the metal foil with resin of the present embodiment, the cured product, forming the resin layer, of the resin composition of the present embodiment preferably has an elongation at break of 100% or more and an elastic modulus of 40 MPa or less. When the cured product of the resin composition of the present embodiment has the above characteristics, a circuit material that has flexibility and extensibility and can be extended, contracted, and bent can be provided, and further there is an advantage that when laminated on an adherend, it can follow the shape of the adherend.

Further, in the metal foil with resin of the present embodiment, it is preferable that the average peeling strength between the resin layer and the metal foil is 0.07 N/25 mm or more. As a result, extremely excellent adhesion can be ensured, and for example, when a circuit pattern is formed on a metal layer, the circuit pattern does not peel off from the resin layer, resulting in a highly reliable circuit board.

(Metal Clad Laminate)

The metal clad laminate of the present embodiment is characterized by including both an insulating layer containing a cured product of the above resin composition and a metal foil. As the metal foil used in the metal clad laminate, the same metal foil as the metal foil described above can be used.

The "cured product" in the present embodiment refers to a state in which a curing reaction is completed through a process of applying energy, such as heat and light, enough for the curing to the resin composition.

In addition, the metal clad laminate of the present embodiment can also be obtained by using the above metal foil with resin or resin film.

Examples of the method of producing a metal clad laminate using the metal foil with resin or resin film obtained as described above include a method of producing a double-sided metal foil or single-sided metal foil laminated body by: stacking one or more of the metal foils with resin or resin films; if necessary, further stacking metal foils such as copper foils on both upper and lower sides or one side thereof; and heat and pressure molding this into an integrated laminate. The heat and pressure conditions can be appropriately set depending on the thickness of the laminate to be produced, the type of the resin composition, and the like. For example, the temperature can be set to 150 to 220° C., the pressure to 0.15 to 5.0 MPa, and the time to 60 to 150 minutes.

Alternatively, the metal clad laminate may be produced by forming a film-like resin composition on the metal foil and heating and pressurizing it, without using the metal foil with resin, the resin film, or the like.

(Wiring Board)

The wiring board of the present embodiment is characterized by having an insulating layer containing a cured product of the above resin composition and conductor wiring.

In a method of manufacturing such a wiring board, a wiring board in which a conductor pattern (conductor wiring) as a circuit is provided on the surface of the laminate can be formed by, for example, etching the metal foil on the surface of the metal clad laminate obtained above in order to form a circuit (wiring). Examples of the method of forming the circuit include: circuit forming methods by, for example, a semi additive process (SAP) and a modified semi additive process (MSAP), in addition to the method described above; and the like.

The present embodiment further includes a circuit mount component in which electronic components are mounted on the above wiring board. The specific electronic components to be mounted are not particularly limited. Examples thereof include, for example, resistors, transistors, signal transmission elements, light emitting elements, solar power generation elements, diodes, switching elements, capacitors, coils, liquid crystal, wireless modules such as Bluetooth (registered trademark), various sensors such as acceleration sensors, humidity sensors, and temperature sensors, chip components used for RFID, etc., and the like.

As described above, the film with resin and the metal foil with resin obtained by using the resin composition of the present embodiment have not only good storage stability but also flexibility and extensibility in their cured products, so that they are very useful for industrial use. Further, the metal clad laminate and the wiring board obtained by curing them have high heat resistance, high adhesion, flexibility, and extensibility.

As described above, the present description discloses various aspects of technology, of which the main technology is summarized below.

A resin composition according to one aspect of the present invention is a resin composition containing a polyrotaxane (A), an epoxy resin (B), and a curing agent (C), in which the curing agent (C) contains an acid anhydride (C-1) in an amount of 0.1 parts by mass or more and less than 10 parts by mass based on a total of 100 parts by mass of the polyrotaxane (A), the epoxy resin (B), and the curing agent (C).

In the resin composition, the curing agent (C) further contains an isocyanate compound (C-2), and a content of the isocyanate compound (C-2) is preferably 0 parts by mass or more and less than 45 parts by mass based on 100 parts by mass of the polyrotaxane (A).

In the resin composition, the curing agent (C) preferably contains 30% by mass or more of a monofunctional acid anhydride.

Further, in the resin composition, a molar ratio of the monofunctional acid anhydride to a hydroxyl group derived from the polyrotaxane (A) is preferably in a range of 0.01 to 0.8.

In addition, the resin composition preferably contains 40 to 89.9 parts by mass of the polyrotaxane (A), 10 to 59.9 parts by mass of the epoxy resin (B), and 0.1 parts by mass to 10 parts by mass or less of the curing agent (C), based on a total of 100 parts by mass of the polyrotaxane (A), the epoxy resin (B), and the curing agent (C).

Further, in the resin composition, a molar ratio of the monofunctional acid anhydride to an epoxy group of the epoxy resin (B) is preferably in a range of 0.01 to 1.1.

In addition, it is preferable that the monofunctional acid anhydride is an alicyclic compound.

The resin composition may further contain a color material (D).

A resin film according to another aspect of the present invention is characterized by including a resin layer containing a dried or partially-cured product of the above resin composition, and a film-supporting base material.

A metal foil with resin according to still another aspect of the present invention is characterized by including a resin layer containing a dried or partially-cured product of the above resin composition, and a metal foil.

A metal clad laminate according to still another aspect of the present invention is characterized by including an insulating layer containing a cured product of the above resin composition, and a metal foil.

A wiring board according to still another aspect of the present invention is characterized by having an insulating layer containing a cured product of the above resin composition, and conductor wiring.

The present invention also includes a circuit mount component in which electronic components are mounted on the wiring board.

A metal foil with resin according to another aspect of the present invention is a metal foil with resin characterized by including a metal foil, and a resin layer laminated on the metal foil, in which the resin layer contains a dried or partially-cured product of a resin composition containing a thermosetting resin, a cured product of the resin composition has an elongation at break of 100% or more and an elastic modulus of 40 MPa or less, and an average peeling strength between the resin layer and the metal foil is 0.07 N/25 mm or more.

Hereinafter, the present invention will be described further specifically with reference to Examples, but the scope of the present invention is not limited thereto.

EXAMPLES

First, various materials used in the present Examples are as follows.

(Polyrotaxane (A))
Polyrotaxane: "SH3400P" manufactured by ASM Inc. (which has PEG as the axial molecule, α-cyclodextrin as the cyclic molecule, and an OH group as the reactive group), hydroxyl group value 72 mgKOH/g, hydroxyl group equivalent 779

(Epoxy Resin (B))
Epoxy resin: "JER1003" manufactured by Mitsubishi Chemical Corporation, molecular weight 1300, epoxy equivalent 650

(Curing Agent (C))
C-1 (Acid Anhydride):
"YH-307" manufactured by Mitsubishi Chemical Corporation, monofunctional acid anhydride type, acid anhydride equivalent 231
"HN-5500E" manufactured by Hitachi Chemical Co., Ltd., monofunctional acid anhydride type, acid anhydride equivalent 168
"H-TMAn" manufactured by Mitsubishi Gas Chemical Co., Inc., monofunctional acid anhydride type, acid anhydride equivalent 198
"HH" manufactured by New Japan Chemical Co., Ltd., monofunctional acid anhydride type, acid anhydride equivalent 154
"SMA EF80" manufactured by Cray Valley, polyfunctional acid anhydride type, acid anhydride equivalent 935

C-2: (Isocyanate Compound)
"DN-950" manufactured by DIC Corporation, polyfunctional isocyanate type (nonvolatile content 75%, ethyl acetate contained), isocyanate equivalent 350

(Color Material (D))
Carbon Black: "Carbon Black No. 52" manufactured by Mitsubishi Chemical Corporation
Cyan pigment: "Heliogen Blue D7079" manufactured by BASF
Cyan dye: "Direct Blue 86" manufactured by Tokyo Chemical Industry Co., Ltd.

(Other Additives)
Imidazole-based curing accelerator: "2E4MZ" manufactured by Shikoku Chemicals Corporation, 2-ethyl-4-methylimidazole)
Dispersant: "BYK-9076" manufactured by BYK Test Example 1

Examples 1 to 11 and Comparative Examples 1 to 3

First, each component was dissolved with stirring in a solvent (MEK/toluene (mass ratio 4/6)) at the blending ratio shown in Table 1 (the numerical value of each component in Table 1 indicates the mass parts of the solid content excluding the solvent). Resin varnishes having a concentration of 50% by mass (Examples 1 to 14 and Comparative Examples 1 to 3) were prepared. After static defoaming, the resin varnish was coated to a release-treated PET film (SP-PET O1 manufactured by Mitsui Chemicals Tohcello, Inc.) using a bar coater. Then, this was dried in an oven at 80° C. for 10 minutes to obtain a dry film made of a dried product of a resin composition. Further, a release-treated PET film (SP-PET O1 manufactured by Mitsui Chemicals Tohcello, Inc.) was pasted to the dry film to obtain a dry resin film with protection in which the dry film (resin layer) was protected.

Separately, the dry film was heated at 160° C. for 5 minutes to obtain a partially-cured film made of a partially-cured product of the resin composition. Further, a release-treated PET film (SP-PET O1 manufactured by Mitsui Chemicals Tohcello, Inc.) was pasted to the partially-cured film to obtain a partially-cured resin film with protection in which the resin layer containing the partially-cured product of the resin was protected.

Further, the dry resin film was separately heated in an oven at 80° C. for 24 hours and then heated at 160° C. for 1 hour to obtain a cured resin film made of a cured product of the resin composition.

Comparative Example 4

A polyurethane film (TPU film) (Estane 58238, 100 micrometers, manufactured by Lubrizol Corporation) was used as the resin film.

Comparative Example 5

A polyimide film (UPILEX S, 25 micrometers, manufactured by Ube Industries, Ltd.) was used as the resin film.

Example 12

Carbon black No. 52 (manufactured by Mitsubishi Chemical Corporation) in an amount of 0.1% by mass with respect to the solid content of the resin varnish having a concentration of 50% by mass obtained in Example 1 and a dispersant BYK-9076 (manufactured by BYK) in an amount of 50% a by mass with respect to the added carbon black were added, and mixed and kneaded with a 3-roll mill to obtain a black varnish. Then, a dry resin film, a dry resin film with protection, a partially-cured resin film, a partially-cured resin film with protection, and a cured resin film were obtained in the same manner as in Example 1.

Example 13

Pigment Blue 15:3 (product name "Heliogen Blue D7079", manufactured by BASF), which is a cyan pigment, in an amount of 1.0% by mass with respect to the solid content of the resin varnish having a concentration of 50% by mass obtained in Example 1 and a dispersant BYK-9076 (manufactured by BYK) in an amount of 50% by mass with respect to the added cyan pigment were added, and mixed and kneaded with a 3-roll mill to obtain a blue resin varnish. Then, a dry resin film, a dry resin film with protection, a partially-cured resin film, a partially-cured resin film with protection, and a cured resin film were obtained in the same manner as in Example 1.

Example 14

Direct Blue 86 (Tokyo Chemical Industry Co., Ltd.), which is a cyan dye, in an amount of 0.1% by mass with respect to the solid content of the resin varnish having a concentration of 50% by mass obtained in Example 1 was added, and mixed and kneaded with a disperser (Homo Disper Model 2.5, manufactured by PRIMIX Corporation) to obtain a blue resin varnish. Then, a dry resin film, a dry resin film with protection, a partially-cured resin film, a partially-cured resin film with protection, and a cured resin film were obtained in the same manner as in Example 1.

TABLE 1

| | | Functional group equivalent (Hydroxyl group, acid anhydride, NCO) | Example 1 | 2 | 3 | 4 | 5 | 6 | 7 | 8 |
|---|---|---|---|---|---|---|---|---|---|---|
| (A) Component | SH3400P | 779 | 100 | 100 | 100 | 100 | 100 | 100 | 100 | 100 |
| (B) Component | JER1003 | 650 | 90 | 11 | 110 | 90 | 90 | 90 | 90 | 90 |
| (C) Component C-1 | YH307 (Monofunctional acid anhydride) | 231 | 2 | 2 | 2 | 10 | 20 | | | |
| | HN-5500E (Monofunctional acid anhydride) | 168 | | | | | | | 2 | |
| | HTMAn (Monofunctional acid anhydride) | 198 | | | | | | 20 | | 2 |
| | HH (Monofunctional acid anhydride) | 154 | | | | | | | | |
| | SMA EF 80 (Polyfunctional acid anhydride) | 935 | | | | | | | | |
| C-2 | DN950 (Polyfunctional isocyanate) | 350 | | | | | | | | |
| Curing accelerator | 2E4MZ | | 1 | 1 | 1 | 1 | 1 | 1 | 1 | 1 |
| (D) Component | Carbon black No. 52 | | | | | | | | | |
| | Heliogen Blue D7079 | | | | | | | | | |
| | C.I. Direct Blue 86 | | | | | | | | | |
| Dispersant | BYK-9076 | | | | | | | | | |
| Molar ratio | Monofunctional Anhydride/OH mol | | 0.067 | 0.067 | 0.067 | 0.337 | 0.674 | 0.787 | 0.093 | 0.079 |
| | Monofunctional Anhydride/epoxy group mol | | 0.063 | 0.512 | 0.051 | 0.313 | 0.625 | 0.730 | 0.086 | 0.073 |
| Parts by mass [%] | C/(A + B + C) | | 1.0 | 1.8 | 0.9 | 5.0 | 9.5 | 9.5 | 1.0 | 1.0 |
| | C-1/(A + B + C) | | 1.0 | 1.8 | 0.9 | 5.0 | 9.5 | 9.5 | 1.0 | 1.0 |
| | C-2/(A) | | 0.0 | 0.0 | 0.0 | 0.0 | 0.0 | 0.0 | 0.0 | 0.0 |
| | Monofunctional acid anhydride/C | | 100.0 | 100.0 | 100.0 | 100.0 | 100.0 | 100.0 | 100.0 | 100.0 |
| | A/(A + B + C) | | 52.1 | 88.5 | 47.2 | 50.0 | 47.6 | 47.6 | 52.1 | 52.1 |
| | B/(A + B + C) | | 46.9 | 9.7 | 51.9 | 45.0 | 42.9 | 42.9 | 46.9 | 46.9 |
| | A/100 parts by mass of total solid content | | 51.8 | 87.7 | 46.9 | 49.8 | 47.4 | 47.4 | 51.8 | 51.8 |
| | B/100 parts by mass of total solid content | | 46.6 | 9.6 | 51.6 | 44.8 | 42.7 | 42.7 | 46.6 | 46.6 |

TABLE 1-continued

|  |  | Example |  |  |  |  |  | Comparative Example |  |  |
|---|---|---|---|---|---|---|---|---|---|---|
|  |  | 9 | 10 | 11 | 12 | 13 | 14 | 1 | 2 | 3 |
| (A) Component | SH3400P | 100 | 100 | 100 | 100 | 100 | 100 | 100 | 100 | 100 |
| (B) Component | JER1003 | 90 | 90 | 90 | 90 | 90 | 90 | 90 | 90 | 95 |
| (C) Component C-1 | YH307 (Monofunctional acid anhydride) |  | 1 | 1 | 2 | 2 | 2 | 0 | 29 |  |
|  | HN-5500E (Monofunctional acid anhydride) |  |  |  |  |  |  |  |  |  |
|  | HTMAn (Monofunctional acid anhydride) |  |  |  |  |  |  |  |  |  |
|  | HH (Monofunctional acid anhydride) | 2 |  |  |  |  |  |  |  |  |
|  | SMA EF 80 (Polyfunctional acid anhydride) |  |  | 2 |  |  |  |  |  |  |
| C-2 | DN950 (Polyfunctional isocyanate) |  |  | 2 |  |  |  |  |  | 45 |
| Curing accelerator | 2E4MZ | 1 | 1 | 1 | 1 | 1 | 1 | 1 | 1 | 1 |
| (D) Component | Carbon black No. 52 |  |  |  | 0.2 |  |  |  |  |  |
|  | Heliogen Blue D7079 |  |  |  |  | 1.9 |  |  |  |  |
|  | C.I. Direct Blue 86 |  |  |  |  |  | 0.2 |  |  |  |
| Dispersant | BYK-9076 |  |  |  | 0.1 | 0.9 |  |  |  |  |
| Molar ratio | Monofunctional Anhydride/OH mol | 0.101 | 0.034 | 0.034 | 0.067 | 0.067 | 0.067 | 0.000 | 0.978 | 0.000 |
|  | Monofunctional Anhydride/epoxy group mol | 0.094 | 0.031 | 0.031 | 0.063 | 0.063 | 0.063 | 0.000 | 0.907 | 0.000 |
| Parts by mass [%] | C/(A + B + C) | 1.0 | 1.6 | 1.6 | 1.0 | 1.0 | 1.0 | 0.0 | 13.2 | 18.8 |
|  | C-1/(A + B + C) | 1.0 | 0.5 | 0.5 | 1.0 | 1.0 | 1.0 | 0.0 | 13.2 | 0.0 |
|  | C-2/(A) | 0.0 | 0.0 | 2.0 | 0.0 | 0.0 | 0.0 | 0.0 | 0.0 | 45.0 |
|  | Monofunctional acid anhydride/C | 100.0 | 33.3 | 33.3 | 100.0 | 100.0 | 100.0 | 0.0 | 100.0 | 0.0 |
|  | A/(A + B + C) | 52.1 | 51.8 | 51.8 | 52.1 | 52.1 | 52.1 | 52.6 | 45.7 | 41.7 |
|  | B/(A + B + C) | 46.9 | 46.6 | 46.6 | 46.9 | 46.9 | 46.9 | 47.4 | 41.1 | 39.6 |
|  | A/100 parts by mass of total solid content | 51.8 | 51.5 | 51.5 | 51.7 | 51.1 | 51.8 | 52.4 | 45.5 | 41.5 |
|  | B/100 parts by mass of total solid content | 46.6 | 46.4 | 46.4 | 46.6 | 46.0 | 46.6 | 47.1 | 40.9 | 39.4 |

[Evaluation Test 1]
(Storage Stability Test)

15 ml of each of the resin varnishes obtained in Examples 1 to 14 and Comparative Examples 1 to 3 was placed in a 30 ml glass bottle and sealed, and allowed to stand at 20° C. The presence or absence of liquidity was visually confirmed after 24 hours and 740 hours. The evaluation criteria for varnish life are as follows.

No liquidity at 24 hours: poor
No liquidity for 24 hours or more to 740 hours: fair
Maintain liquidity for 740 hours or more: good
(Melting Characteristics: Resin Flowability)

A 5 cm×5 cm piece was cut out from each of the dry resin films with protection obtained in Examples 1 to 14 and Comparative Examples 1 to 3. This was set in a vacuum press apparatus heated to 110° C., and left for 15 minutes with a load of 1 kN applied. The evaluation criteria were as follows: a piece in which the resin had flowed out of the cover of the film was evaluated as having a resin flow ("yes"), and a piece in which the resin had not flowed out as having no resin flow ("no"). According to this, evaluations were made.

(Peeling Strength Test (Adhesion to Copper Foil))

A copper foil (CF-T9DA-SV, 12 micrometers, manufactured by Fukuda Metal Foil & Powder Co., Ltd.) was pasted, at 25° C., to each of the partially-cured resin film surfaces of the partially-cured resin films with protection obtained in Examples 1 to 14 and Comparative Examples 1 to 3 while applying a roller load of 2 kg. Then, the PET film was peeled off, and the copper foil was pasted while applying a roller load of 2 kg. Next, it was cut into a strip of 2.5 cm×10.0 cm to obtain a test piece.

Using the test piece, 90° peel strength was measured, at 25° C., with a peel tester (EZtest manufactured by Shimadzu Corporation) at a tensile speed of 100 mm/min. The curve between test force vs stroke includes (A) rising region, (B) steady region, and (C) peeling end region. In this test, an average peeling strength F was calculated by calculating the average value of peeling force f(N) in the (B) steady peeling region. The obtained average peeling strength was defined as F (N/25 mm). The peeling strength in this test was determined as pass/fail based on the following criteria.

Less than 0.07 N/25 mm, cannot be pasted to copper foil: poor
0.07 N/25 mm or more: good
(Storage Stability of Partially-Cured Product: Adhesion Test to Copper Foil after Storage for One Month)

After the partially-cured resin film with protection was stored at 25° C. for 30 days, the protective layer was peeled off. A copper foil (CF-T9DA-SV, 12 micrometers, manufactured by Fukuda Metal Foil & Powder Co., Ltd.) was pasted, at 25° C., to the partially-cured resin film surface while applying a roller load of 2 kg. The adhesion was determined based on the following criteria.

No adhesion mark on the partially-cured layer when the copper foil was peeled off: Not adhesive
Adhesion marks on the partially-cured layer when the copper foil was peeled off, or film was deformed or damaged: Adhesive
(Adhesive Handleability)

A partially-cured resin film that had a peeling strength of 0.07 N/25 mm or more in the peeing strength test and could be pasted to the copper foil (both immediately after the partially-cured resin film was produced and one month after the production) was determined as "pass", and one that did not meet the criteria for any one of the above was determined as "fail".

The results of the above evaluation tests are summarized in Table 2 below.

(Mechanical Evaluation Test)

Preparation of Test Piece

No. 6 dumbbell test pieces specified by JIS K 6251 were punched out from the cured films obtained in Examples 1 to 14 and Comparative Examples 1 to 3, and from Comparative Example 4 (plastic polyurethane film) and Comparative Example 5 (polyimide film), which were used as test pieces. In Comparative Example 1, the film was not cured and the test piece could not be formed.

Measurement of Elastic Modulus and Elongation at Break

Then, using the obtained test pieces, tensile tests were carried out using an autograph (AGS-X) manufactured by Shimadzu Corporation under the following conditions.

Temperature: 25° C.
Load cell: 50 N
Initial distance between grips: 35 mm
Tensile speed: 25 mm/min Method of calculating elastic modulus: The slope of r-σ was determined from all stress (σ) data corresponding to the strain (r) of 0.01 to 0.05 using the least squares method, which was defined as an elastic modulus. The strain (r) and stress (σ) are expressed by the following equations.

Strain$(r) = x/35$ (where, $x$: moving distance of grips)

Stress$(\sigma) = F/(d \cdot l)$ (where, $F$: test force, $d$: film thickness, $l$: width of test piece)

The elongation at break (%) of the film is expressed by the following equation using the moving distance of the grips at break:

Elongation at break (%) of film = $x/35 \times 100$

Stress at break of film = $F'/(d \cdot l)$ (where, $F'$: test force at break, $d$: film thickness, $l$: width of test piece)

Determination of Flexibility

When a case where the elastic modulus was 40 MPa or less was determined to be flexible (good), and a case where the elastic modulus was not 40 MPa or less was determined to be inflexible (poor).

The results of the mechanical test are summarized in Table 2 (Examples 1 to 14 and Comparative Examples 1 to 3) and Table 3 (Comparative Examples 4 to 5).

(Heat Resistance Evaluation Test)

Heat Resistance Test

The heat resistance of each of the films of Examples 1 to 14 was evaluated using TG-DTA (7300) manufactured by Seiko Instruments Inc. Apparatus conditions were set such that the temperature was raised from 30° C. to 500° C. at a rate of 10° C./min under air flow. The heat resistant temperature was defined as the temperature at which the mass was reduced by 5% or the temperature at which the film was melted. The results were 300 to 330° C., as summarized in Tables 2 and 3.

TABLE 2

| | | | Example 1 | Example 2 | Example 3 | Example 4 | Example 5 | Example 6 | Example 7 | Example 8 | Example 9 |
|---|---|---|---|---|---|---|---|---|---|---|---|
| Varnish | Storage stability (25° C.) Time when liquidity is maintained | Less than 24 hours: poor 24 hours or more: fair 740 hours or more: good | good | good | good | good | good | good | good | good | good |
| Film dried product | Melting characteristics (100° C.) | With resin flow: yes No resin flow: no | yes | yes | yes | yes | yes | yes | yes | yes | yes |
| Partially-cured product | (1) Adhesion to copper foil [Average peeling strength at 25° C.] | F(N/25 mm) Cannot be pasted to copper foil or less than 0.07N/25 mm: poor 0.07N/25 mm or more: good | good | good | good | good | good | good | good | good | good |
| | | Numerical value | 15 | 13 | 5 | 3 | 0.1 | 0.07 | 10 | 14 | 11 |
| | (2) Storage stability of partially-cured product [Adhesion to copper foil after being left at 25° C., 50% for 30 days] | No adhesion mark on partially-cured layer when copper foil is peeled off: Not adhesive Adhesion marks on partially-cured layer when copper foil is peeled off, or film is deformed or damaged: Adhesive | Adhesive | Adhesive | Adhesive | Adhesive | Adhesive | Adhesive | Adhesive | Adhesive | Adhesive |
| | Evaluation of adhesive handleability | Meet the following Average peeling strength: pass Can be pasted to copper foil (both immediately after partially-cured film is produced and one month after the production) | pass | pass | pass | pass | pass | pass | pass | pass | pass |
| Cured product | Elastic modulus | MPa | 2.1 | 1.0 | 10.0 | 14.5 | 31.1 | 40.0 | 3.0 | 4.0 | 3.2 |
| | Elongation | % | 220 | 110 | 160 | 270 | 170 | 160 | 200 | 210 | 190 |
| | Determination of flexibility | Elastic modulus 40 MPa or less | good | good | good | good | good | good | good | good | good |
| | Heat-resistance | ° C. | 321 | 300 | 330 | 320 | 318 | 325 | 319 | 324 | 302 |

TABLE 2-continued

|  |  |  | Example 10 | Example 11 | Example 12 | Example 13 | Example 14 | Comparative Example 1 | Comparative Example 2 | Comparative Example 3 |
|---|---|---|---|---|---|---|---|---|---|---|
| Varnish | Storage stability (25° C.) Time when liquidity is maintained | Less than 24 hours: poor 24 hours or more: fair 740 hours or more: good | fair | fair | good | good | good | good | good | poor |
| Film dried product | Melting characteristics (100° C.) | With resin flow: yes No resin flow: no | yes | yes | yes | yes | yes | yes | yes | no |
| Partially-cured product | (1) Adhesion to copper foil [Average peeling strength at 25° C.] | F(N/25 mm) Cannot be pasted to copper foil or less than 0.07N/25 mm: poor 0.07N/25 mm or more: good | good | good | good | good | good | Cannot form film | poor | poorx |
|  |  | Numerical value | 5 | 5 | 12 | 12 | 13 |  | 0.05 | Not adhered |
|  | (2) Storage stability of partially-cured product [Adhesion to copper foil after being left at 25° C., 50% for 30 days] | No adhesion mark on partially-cured layer when copper foil is peeled off: Not adhesive Adhesion marks on partially-cured layer when copper foil is peeled off, or film is deformed or damaged: Adhesive | Adhesive | Adhesive | Adhesive | Adhesive | Adhesive | Not adhesive | — |  |
|  | Evaluation of adhesive handleability | Meet the following Average peeling strength: pass Can be pasted to copper foil (both immediately after partially-cured film is produced and one month after the production) | pass | pass | pass | pass | pass |  | fail | fail |
| Cured product | Elastic modulus | MPa | 2.5 | 1.9 | 2.5 | 2.6 | 2.2 |  | 45.5 | 49.2 |
|  | Elongation | % | 200 | 220 | 190 | 190 | 200 |  | 150 | 140 |
|  | Determination of flexibility | Elastic modulus 40 MPa or less | good | good | good | good | good |  | poor | poor |
|  | Heat-resistance | ° C. | 310 | 311 | 322 | 321 | 318 |  | 319 | 310 |

TABLE 3

|  | Examples | Comparative Example | |
|---|---|---|---|
|  | 1 to 14 | 4 | 5 |
| Structure | 100 um-film | 100 um-TPU film | 25 um-Polyimide film |
| Elastic modulus MPa | 1.0 to 40.0 | 10 | >5000 |
| Elongation % | 110 to 270 | >1000 | >10 |
| Flexibility | good | good | poor |
| Heat-resistance When mass reduced by 5% or melted | 300 to 330 | Melted at 130° C. | >400 |

Test Example 2

Example 15: Copper Foil with Single-Sided Resin, Copper Foil with Single-Sided Partially-Cured Resin, Metal Clad Laminate A copper foil with single-sided resin having, on one side, a resin layer made of a dried product of the resin composition, a copper foil with single-sided partially-cured resin having, on one side, a resin layer made of a partially-cured product of the resin composition, and a metal clad laminate having, on one side, a resin layer made of a cured product of the resin composition were obtained by performing the same operations as in Example 1, except that the release-treated PET film (SP-PET O1 manufactured by Mitsui Chemicals Tohcello, Inc.) was changed to a 12-μm thick copper foil ("CF-T9DA-SV", manufactured by Fukuda Metal Foil & Powder Co., Ltd.).

Further, by pasting a release-treated PET film (SP-PET O1 manufactured by Mitsui Chemicals Tohcello, Inc.), a copper foil with single-sided resin (with protection), a copper foil with single-sided partially-cured resin (with protection), and a metal clad laminate (with protection), the resin layer of each of which was protected, were obtained.

Example 16: Double-Sided Copper Foil with Partially-Cured Resin and Double-Sided Metal Clad Laminate By pasting a 12-μm thick copper foil ("CF-T9DA-SV" manufactured by Fukuda Metal Foil & Powder Co., Ltd.) to the side of the resin layer of the copper foil with single-sided partially-cured resin obtained in Example 15 using a vacuum laminator, a double-sided copper foil with partially-cured resin, which has copper foil layers on both sides and the intermediate layer of which is a resin layer made of a partially-cured product of the resin composition, was obtained. The temperature of the vacuum laminator was set to 50° C., the decompression condition to 1 hPa for 20 seconds, and the pressure condition to 0.6 MPa for 60 seconds. Further, by heating the double-sided copper foil with partially-cured resin obtained at 80° C. for 24 hours and then heating at 160° C. for 60 minutes, a double-sided metal clad laminate, which has copper foil layers on both sides and the intermediate layer of which is a cured product of the resin composition, was obtained.

Example 17: Copper Foil with Single-Sided Black Resin, Copper Foil with Single-Sided Partially-Cured Black Resin, and Metal Clad Laminate Using the Same A copper foil with single-sided resin, a copper foil with single-sided partially-cured resin, and a single-sided metal clad laminate, the resin layer of each of which is black, were obtained in the same manner as in Example 15, except that the resin varnish used in Example 15 was changed to the resin varnish of Example 12. Further, by pasting a release-treated PET film (SP-PET O1 manufactured by Mitsui Chemicals Tohcello, Inc.), a copper foil with single-sided resin (with protection), a copper foil with single-sided partially-cured resin (with protection), and a metal clad laminate (with protection), the resin layer of each of which was protected, were obtained.

Example 18: Double-Sided Copper Foil with Partially-Cured Resin and Double-Sided Metal Clad Laminate A double-sided copper foil with partially-cured black resin which is a resin layer made of a partially-cured product of the resin composition and a double-sided metal clad laminate, which has copper foil layers on both sides and the intermediate layer of which is a cured product (black) of the resin composition, were obtained in the same manner as in Example 16, except that in Example 16, the copper foil with single-sided partially-cured resin was changed to the copper foil with single-sided partially-cured black resin of Example 17.

Comparative Example 6: Double-Sided Copper Foil with Resin

A copper foil with single-sided partially-cured resin, having, on one side, a resin layer made of a partially-cured product of the resin composition, was obtained in the same manner as in Example 15, except that in Example 15, the resin varnish was changed from the varnish of Example 1 to the resin varnish of Comparative Example 2, and a 12-μm thick copper foil ("CF-T9DA-SV" manufactured by Fukuda Metal Foil & Powder Co., Ltd.) was pasted to the side of the resin layer using a vacuum laminator. Thereby, a double-sided copper foil with partially-cured resin, which has copper foil layers on both sides and the intermediate layer of which is a resin layer made of a partially-cured product of the resin composition, was obtained. The temperature of the vacuum laminator is 50° C., the decompression condition is 1 hPa for 20 seconds, and the pressure condition is 0.6 MPa for 60 seconds. By heating the double-sided copper foil with partially-cured resin obtained at 80° C. for 24 hours and then heating at 160° C. for 1 hour, a double-sided metal clad laminate, which has copper foil layers on both sides and is a cured product of the resin composition, was obtained.

Example 19: Single-Sided Copper Wiring Board

The copper foil with single-sided cured resin with protection obtained in Example 15 was cut into a rectangular shape of 12 cm×2.5 cm, and a dry film resist was laminated on the surface of the copper foil. This was developed by photolithography and the copper foil was etched. After wiring 2 was formed on a resin layer 1 with the pattern shown in FIG. 1, a PET film (protective layer) 3 was peeled off, to obtain a wiring board.

Example 20: Double-Sided Copper Wiring Board

Figure 2:
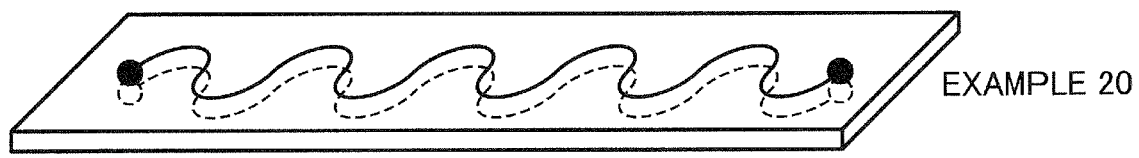
FIG. 2 is a schematic view showing a wiring pattern of a double-sided wiring board formed in Example 20.

The double-sided metal clad laminate obtained in Example 16 was cut into a rectangular shape of 12 cm×2.5 cm, and dry film resists were laminated on the surfaces of the copper foils on both sides. This was developed by photolithography and the copper foils were etched. Thereby, a double-sided wiring board having, on both sides, the wiring patterns shown in FIG. 2 was obtained.

Example 21: Silver Wiring Board

Figure 3:
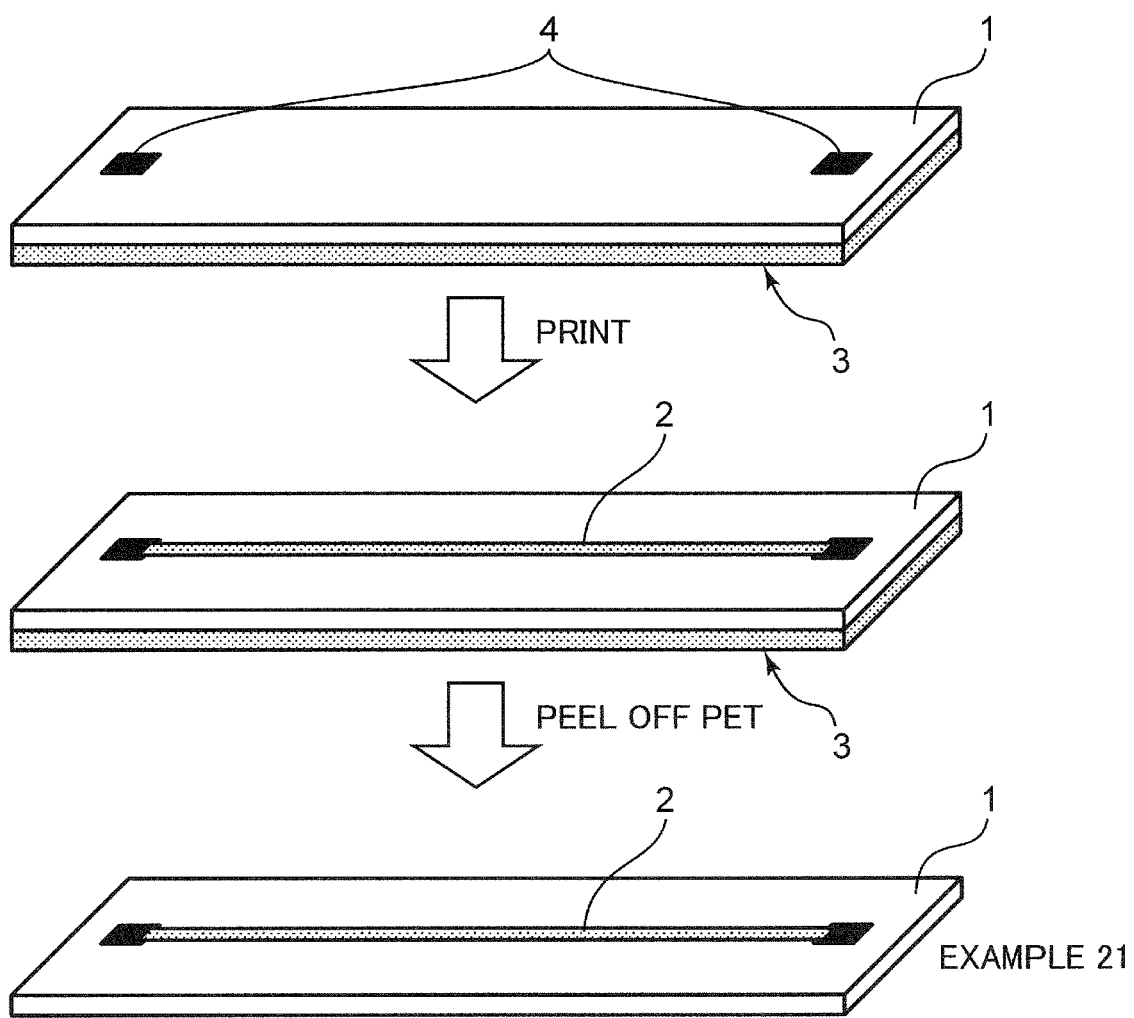
FIG. 3 is a schematic view showing a method of preparing a wiring board in Example 21.

The metal clad laminate with protection obtained in Example 15 was cut into a rectangular shape of 15 cm×2.5 cm, and a dry film resist was laminated on the surface of the copper foil. This was developed by photolithography and the copper foil was etched. Thereby, a circuit board, on which a copper foil land 4 is formed in the pattern shown in FIG. 3 on the surface of the copper foil, was obtained. Then, silver nanopaste (PE873 manufactured by Dupont) was printed with a width of 1 mm and a length of 130 mm using a screen plate, and then after printing, this was cured at 150° C. for 10 minutes. Thereafter, the PET film (protective layer) 3 was peeled off to obtain a wiring board.

Example 22: Silver Wiring Board

Figure 4:
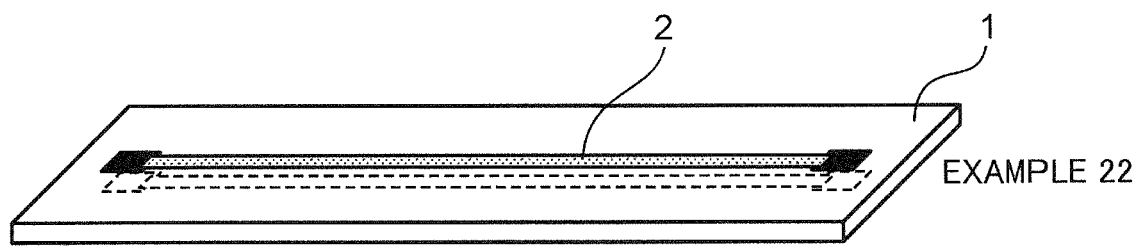
FIG. 4 is a schematic view showing a double-sided wiring board prepared in Example 22.

The double-sided metal clad laminate obtained in Example 16 was cut into a rectangular shape of 15 cm×2.5 cm, and a dry film resist was laminated on one side. This was developed by photolithography and copper foil etching was performed. Thereby, a circuit board, on which copper foil lands are formed in the pattern shown in FIG. 4 on the surfaces of the copper foils on both sides, was obtained. Then, silver nanopaste (PE873 manufactured by Dupont) was printed using a screen plate and then cured at 150° C. for 10 minutes. Next, a dry film resist was laminated on the copper foil on the opposite side. This was developed by photolithography, and the copper foil was etched with the pattern shown in FIG. 4 by copper foil etching. After silver nanopaste (PE873 manufactured by Dupont) was printed with a width of 1 mm and a length of 130 mm using a screen plate, it was cured at 150° C. for 10 minutes to obtain a wiring board.

Example 23: Circuit Mount Component

Figure 5:
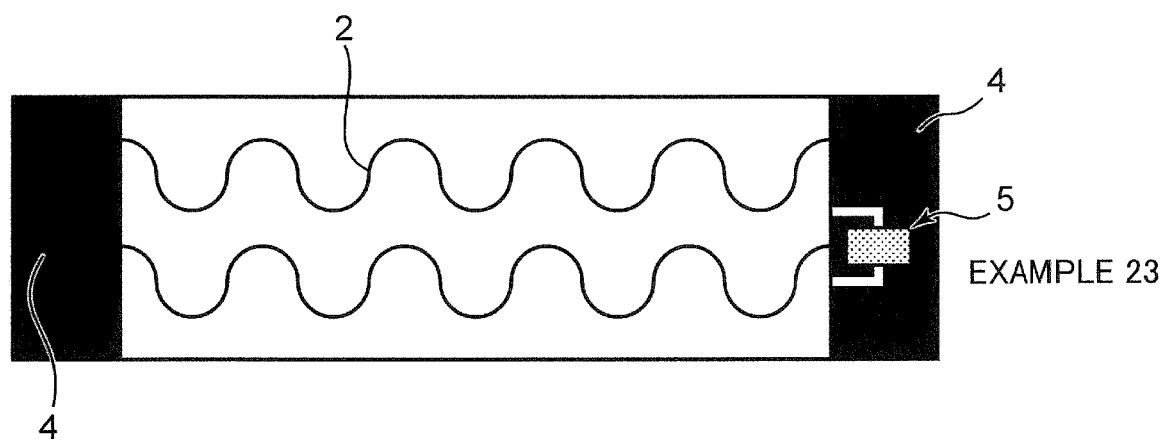
FIG. 5 is a schematic view showing a circuit mount component prepared in Example 23.

The PET film (protective layer) of the single-sided metal clad laminate (with protection) obtained in Example 15 was peeled off, and a release-treated polyimide film was pasted. Then, it was cut into a rectangular shape of 16 cm×3.5 cm. Then, a dry film resist was laminated on the surface of the copper foil. This was developed by photolithography and copper foil etching was performed. Thereby, a circuit board, on which a copper foil wiring pattern 2 and a copper foil land 4 shown in FIG. 5 are formed on the surfaces of the copper foils on both sides, was obtained. Thereafter, cream solder was printed in the copper foil land portion of the obtained circuit board with a metal mask, and an electronic component (chip resistor: 1608, 5025 size) 5 was mounted. The mounting was performed on a hot plate set to 180° C. Then, the polyimide layer was peeled off to obtain a circuit mount component.

[Evaluation Test 2]
(Solder Heat Resistance Test)

Solder heat resistance tests for the single-sided metal clad laminate of Example 15, the double-sided metal clad laminates of Examples 16 and 18, the film of Comparative Example 5, and the double-sided metal clad laminate of Comparative Example 6 were performed according to JIS C6481 in order to check the presence or absence of swelling. The temperature of the solder bath is 260° C. and the float time is 5 seconds. The results are shown in Table 4.

(Conductivity Test During Extension and Contraction)

Each of the wiring boards and circuit mount components manufactured in Examples 19 to 23 was connected to a battery (power supply) and an LED as shown in FIG. 6, so that the lighting of the LED was confirmed when it was not extended. The copper foil land and the wiring were connected by soldering. Then, it was fixed to a high-precision automated stage and was extended in the long side direction by 20% (2.4 cm, Examples 19, 20, 23), (3.0 cm, Examples 21, 22), so that it was confirmed that the LED was lit. Finally, the extension was returned to 0% in order to confirm that the LED was continuously lit.

TABLE 4

| | Example | | | Comparative Example | |
|---|---|---|---|---|---|
| | 15 | 16 | 18 | 5 | 6 |
| Solder heat resistance JIS C6481 260° C. 5 seconds | No swelling | No swelling | No swelling | Melted | With swelling |

(Results/Discussion)

As shown in the above Test Example 1 and Test Example 2, the resin composition of the examples of the present invention could form a stretchable insulating layer having both stretchability and solder heat resistance, the storage stabilities of the resin varnish and the partially-cured film were high, and the adhesion to a metal foil was also good. In addition, it could be confirmed that the resin layer can be colored.

On the other hand, the resin composition of Comparative Example 1, containing no curing agent (acid anhydride), could not produce a film. On the other hand, the resin composition of Comparative Example 2, containing an excessive amount of an acid anhydride, was inferior in the adhesion to a metal foil and sufficient flexibility could not be obtained either. Further, the resin composition of Comparative Example 3, containing a large amount of an isocyanate compound instead of containing an acid anhydride, was inferior in the adhesion to a metal foil and flexibility, and sufficient storage stability could not be obtained either.

Further, the metal clad laminates obtained in Examples were also more excellent in heat resistance than the polyurethane film to be used in the conventional FPC materials, and were more excellent in flexibility than a polyimide film. Therefore, it was found by the present Examples that a stretchable material having excellent performance unprecedented in the field of flexible circuit boards can be provided.

In order to express the present invention, the present invention were appropriately and sufficiently described through the embodiments with reference to specific examples, drawings, etc., but it should be recognized that a person skilled in the art may easily modify and/or improve the above embodiments. Therefore, unless the modified or improved forms implemented by the person skilled in the art are at a level that departs from the scope of the rights of claims described in the claims, it is construed that the modified or improved forms are included in the scope of the rights of the claims.

INDUSTRIAL APPLICABILITY

The present invention has a wide range of industrial applicability in the technical field of electronic materials and various devices using the electronic materials.

The invention claimed is:

1. A resin composition containing
   a polyrotaxane (A),
   an epoxy resin (B), and
   a curing agent (C),
   wherein the curing agent (C) contains an acid anhydride (C-1) in an amount of 0.5 parts by mass or more and 9.5 parts by mass or less based on a total of 100 parts by mass of the polyrotaxane (A), the epoxy resin (B), and the curing agent (C).

2. The resin composition according to claim 1, wherein the curing agent (C) contains an isocyanate compound (C-2), and
   a content of the isocyanate compound (C-2) is less than 45 parts by mass based on 100 parts by mass of the polyrotaxane (A).

3. The resin composition according to claim 1, wherein the curing agent (C) contains 30% by mass or more of a monofunctional acid anhydride.

4. The resin composition according to claim 3, wherein a molar ratio of the monofunctional acid anhydride to a hydroxyl group derived from the polyrotaxane (A) is in a range of 0.01 to 0.8.

5. The resin composition according to claim 3, wherein a molar ratio of the monofunctional acid anhydride to an epoxy group of the epoxy resin (B) is in a range of 0.01 to 1.1.

6. The resin composition according to claim 3, wherein the monofunctional acid anhydride is an alicyclic compound.

7. The resin composition according to claim 1, containing
   40 to 89.9 parts by mass of the polyrotaxane (A),
   10 to 59.9 parts by mass of the epoxy resin (B), and
   0.1 parts by mass to 10 parts by mass or less of the curing agent (C),
   based on a total of 100 parts by mass of the polyrotaxane (A), the epoxy resin (B), and the curing agent (C).

8. The resin composition according to claim 1, further containing a color material (D).

9. A resin film comprising a resin layer containing a dried or partially-cured product of the resin composition according to claim 1, and a film-supporting base material.

10. A metal foil with resin, comprising a resin layer containing a dried or partially-cured product of the resin composition according to claim 1, and a metal foil.

11. A metal clad laminate comprising an insulating layer containing a cured product of the resin composition according to claim 1, and a metal foil.

12. A wiring board having an insulating layer containing a cured product of the resin composition according to claim 1, and conductor wiring.

13. A circuit mount component in which an electronic component is mounted on the wiring board according to claim 12.

* * * * *